United States Patent
Ghosh et al.

(10) Patent No.: US 11,181,564 B2
(45) Date of Patent: Nov. 23, 2021

(54) DISTRIBUTED CONTROL OF ELECTRIC POWER GRIDS

(71) Applicant: International Business Machines Corporation, Armonk, NY (US)

(72) Inventors: Soumyadip Ghosh, Peekskill, NY (US); Dung Phan, Ossining, NY (US); Xu Sun, Atlanta, GA (US)

(73) Assignee: International Business Machines Corporation, Armonk, NY (US)

( * ) Notice: Subject to any disclaimer, the term of this patent is extended or adjusted under 35 U.S.C. 154(b) by 995 days.

(21) Appl. No.: 14/318,658

(22) Filed: Jun. 29, 2014

(65) Prior Publication Data
US 2015/0377936 A1      Dec. 31, 2015

(51) Int. Cl.
*G01R 21/133*      (2006.01)
*G01R 19/25*       (2006.01)

(52) U.S. Cl.
CPC ........ *G01R 21/133* (2013.01); *G01R 19/2513* (2013.01)

(58) Field of Classification Search
CPC .............................. G06F 1/28; G01R 21/133
USPC ..... 702/57, 60, 61, 62, 64, 188, 58; 700/286
See application file for complete search history.

(56) References Cited

U.S. PATENT DOCUMENTS

| | | | |
|---|---|---|---|
| 8,756,556 B1 * | 6/2014 | Raghunathan | H02J 3/06 716/109 |
| 2005/0034023 A1 * | 2/2005 | Maturana | G06Q 10/06 714/37 |
| 2007/0276547 A1 | 11/2007 | Miller | |
| 2008/0039980 A1 | 2/2008 | Pollack et al. | |
| 2010/0076613 A1 * | 3/2010 | Imes | G06Q 50/06 700/287 |

(Continued)

FOREIGN PATENT DOCUMENTS

| | | |
|---|---|---|
| CN | 102820662 A | 12/2012 |
| CN | 103001218 A | 3/2013 |
| JP | 02008301641 A | 12/2008 |

OTHER PUBLICATIONS

Aponte, E.E. et al; "Time optimal load shedding for distributed power systems," Power Systems, IEEE Transactions on , vol. 21, No. 1, pp. 269,277, Feb. 2006 doi: 10.1109/TPWRS.2005.857826.

(Continued)

*Primary Examiner* — Eman A Alkafawi
(74) *Attorney, Agent, or Firm* — Daniel Morris; Otterstedt, Wallace & Kammer, LLP

(57) ABSTRACT

A method for determining power output levels of a plurality of nodes in an electric power system includes receiving, at a first node of the plurality of nodes, voltage information and multipliers of all neighboring nodes of the first node within the electric power system, determining, by the first node, a local power generation and a local voltage using the voltage information and the multipliers of the neighboring nodes and distributing the local power generation and the local voltage to the neighboring nodes, determining, by the first node, an estimated voltage of each of the neighboring nodes and distributing the estimated voltage to each of the neighboring nodes, and updating, by the first node, a local multiplier using the voltage information received from the neighboring nodes and the estimated voltage of each of the neighboring nodes determined by the node.

14 Claims, 4 Drawing Sheets

(56) References Cited

U.S. PATENT DOCUMENTS

| | | | |
|---|---|---|---|
| 2010/0179862 A1 | 7/2010 | Chassin et al. | |
| 2011/0175443 A1* | 7/2011 | Koyanagi | H02J 3/32 307/21 |
| 2011/0282508 A1* | 11/2011 | Goutard | H04L 63/20 700/293 |
| 2012/0239218 A1 | 9/2012 | Forbes, Jr. | |
| 2012/0271475 A1* | 10/2012 | Wang | H02J 3/14 700/295 |
| 2013/0184889 A1 | 7/2013 | Fan et al. | |
| 2014/0025351 A1* | 1/2014 | Ghosh | G06F 17/5009 703/2 |
| 2015/0025696 A1* | 1/2015 | Hug | G06Q 50/06 700/286 |
| 2015/0094965 A1* | 4/2015 | Schneider | G01R 21/133 702/58 |
| 2015/0340863 A1* | 11/2015 | Low | G05B 15/02 700/286 |

OTHER PUBLICATIONS

Ilic, Marija D. et al; "Preventing future blackouts by means of enhanced electric power systems control: from complexity to order." Proceedings of the IEEE 93, No. 11 (Nov. 2005): 1920-1941.

Venayagamoorthy, Ganesh K. "Potentials and promises of computational intelligence for smart grids." In Power & Energy Society General Meeting, Jul. 26-30, 2009. PES'09. IEEE, pp. 1-6. IEEE, 2009.

Andy X. Sun, et al., "Fully Decentralized AC Optimal Power Flow Algorithms," Power and Energy Society General Meeting (PES), 2013 IEEE, pp. 1-5, Jul. 21-25, 2013, Vancouver, BC, Canada (Grace Period Disclosure).

* cited by examiner

DISTRIBUTED CONTROL OF ELECTRIC POWER GRIDS

GOVERNMENT LICENSE RIGHTS

This invention was made with Government support under Contract No.: DE-0E0000190 awarded by Department of Energy. The Government has certain rights in this invention.

STATEMENT REGARDING PRIOR DISCLOSURES BY THE INVENTOR OR A JOINT INVENTOR

The following disclosure(s) are submitted under 35 U.S.C. § 102(b)(1)(A):

DISCLOSURE(S): ANDY X. SUN, et al., Fully Decentralized AC Optimal Power Flow Algorithms, Power and Energy Society General Meeting (PES), 2013 IEEE, pages 1-5, Jul. 21-25, 2013, Vancouver, BC, Canada (Grace Period Disclosure).

BACKGROUND

The present disclosure relates to methods for determining power output levels of generators in an electric power system.

Control of electric power grids (e.g., in dispatching energy) is becoming more important to the generation of electricity. For example, centralized optimal power flow (OPF) algorithms have been implemented for parallelization of certain computation steps, market coordination, convex relaxation formulation of OPF and decentralization to cliques, and linearized approximation of OPF and decentralization to sub-systems.

BRIEF SUMMARY

According to an exemplary embodiment of the present invention, a method for determining power output levels of a plurality of nodes in an electric power system includes receiving, at a first node of the plurality of nodes, voltage information and multipliers of all neighboring nodes of the first node within the electric power system, determining, by the first node, a local power generation and a local voltage using the voltage information and the multipliers of the neighboring nodes and distributing the local power generation and the local voltage to the neighboring nodes, determining, by the first node, an estimated voltage of each of the neighboring nodes and distributing the estimated voltage to each of the neighboring nodes; and updating, by the first node, a local multiplier using the voltage information received from the neighboring nodes and the estimated voltage of each of the neighboring nodes determined by the node.

BRIEF DESCRIPTION OF THE SEVERAL VIEWS OF THE DRAWINGS

Preferred embodiments of the present invention will be described below in more detail, with reference to the accompanying drawings.

DETAILED DESCRIPTION

According to an exemplary embodiment of the present invention, a system and method is configured for determining power output levels of generators in an electric power system such as a smart grid environment. Embodiments of the present invention implement the smart grid environment including a number of control objects. These control objects include distributed generators (power plants, solar power installations, wind power farms, and the like), energy storage installations (e.g., pumped-storage hydroelectricity, batteries, molten salt, etc.), plug-in electric vehicles, etc. According to an exemplary embodiment of the present invention, a system and method is configured for real time, dynamic interaction between the control objects and the electric power system via two-way communication. In one or more embodiments of the present invention, the system and method include an incentive network.

Figure 1:
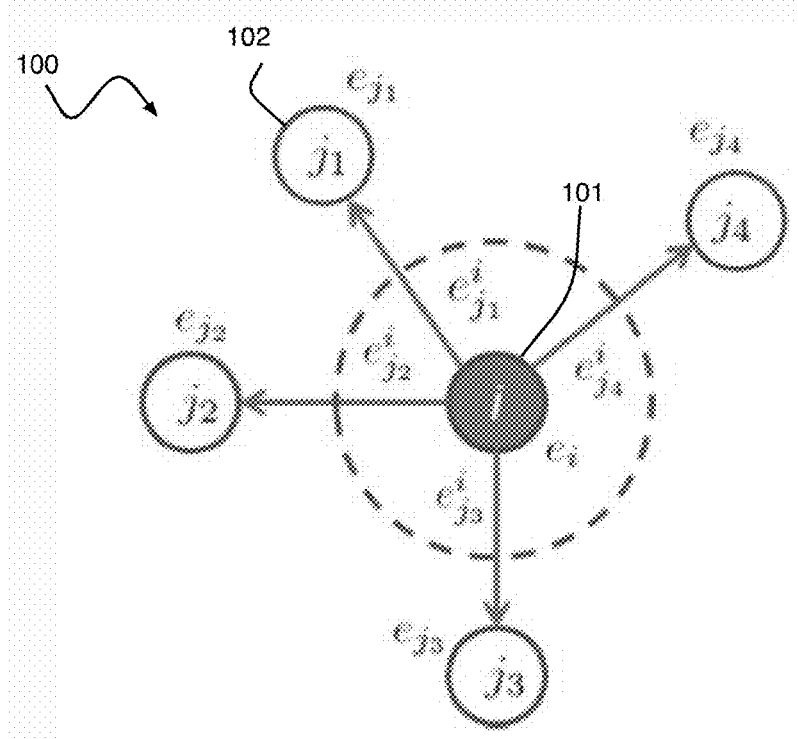
FIG. 1 shows an exemplary network according to an exemplary embodiment of the present invention.

FIG. 1 shows an exemplary network 100 in an electric power system including a generator node 101 and a plurality of neighboring nodes j, e.g., 102. At each node i, a set of auxiliary variables $e_j^i(f_j^i)$ are introduced, which represents the real (imaginary) part of the voltage of neighbor node j, observed from node i. Only the real part, $e_j^i$, is shown in FIG. 1. Local values at node i are encircled by a broken line.

In one or more embodiments of the present invention, an optimal power flow (OPF) is determined enabling decentralized (i.e., local computation) real-time control of generation and consumption in the electric power system. The OPF is fully decentralization down to nodal level in the network. Furthermore, in one or more embodiments of the present invention, the OPF coordination is fully localized to interaction between neighboring nodes, enabling the OPF to automatically adapt to topological changes of the network without the need for a priori computation or information gathering. For example, the information of a first node in the network is shared with its immediate neighbors; a second node in a different zone does not know any of the information of the first node. The OPF improves cost efficiencies, simplifies or eliminates the collection of information from the control objects, and enables real-time, dynamic control without requiring central coordination.

According to an exemplary embodiment of the present invention, the OPF uses a nonlinear alternating current (AC) power flow model, requiring no global information (e.g., transmission resistances and generation limits for all control objects in a system gathered by a central operator), and which automatically adapts to local grid topology changes and resource changes of the network due to the local computations.

The framework of alternating direction method of multipliers can be defined as follows:

Let N denote the set of nodes in a power network. Let $P_i^G$, $Q_i^G$ be the real and reactive powers produced by generator at node i, and $P_i^D$, $Q_i^D$ be the real and reactive powers consumed by load at node i. The complex voltage at node i can be represented by its real and imaginary parts as $e_i$, $f_i$. Let $\delta(i)$ be the set of nodes connected to i, and $g_{ij}$ and $b_{ij}$ denote the conductance and susceptance of the branch connecting nodes i,j. Define $g_{ii}$ and $b_{ii}$ as the self-conductance and the self-susceptance at node i, respectively.

In a case where node i does not have a generator, the lower and upper bounds of $P_i^G$ and $Q_i^G$ are set to zero.

The nodal voltage is a complex number, and can be represented in rectangular coordinates or in polar coordinates.

The AC OPF problem can be written in a rectangular coordinate form as follows:

$$\min_{P^G, Q^G, e, f} \sum_{i=1}^N f_i(P_i^G)$$

$$\text{s.t. } P_i^G - P_i^D = \sum_{j=1}^N [e_i(g_{ij}e_j - b_{ij}f_j) + f_i(g_{ij}f_j + b_{ij}e_j)], \forall i$$

$$Q_i^G - Q_i^D = \sum_{j=1}^N [f_i(g_{ij}e_j - b_{ij}f_j) - e_i(g_{ij}f_j + b_{ij}e_j)], \forall i,$$

$$\underline{P}_i \leq P_i^G \leq \overline{P}_i, \forall i,$$

$$\underline{Q}_i \leq Q_i^G \leq \overline{Q}_i, \forall i,$$

$$\underline{V}_i^2 \leq e_i^2 + f_i^2 \leq \overline{V}_i^2, \forall i.$$

where $f_i(P_i^G)$ is the variable production cost of generator i, assuming to be a convex quadratic function.

The AC OPF problem can be written in a polar coordinate form as follows:

$$\min_{P^G, Q^G, e, f} \sum_{i=1}^N f_i(P_i^G)$$

$$\text{s.t. } P_i^G - P_i^D = \sum_{j=1}^N V_i V_j [g_{ij}\cos(\theta_i - \theta_j) + b_{ij}\sin(\theta_i - \theta_j)], \forall i,$$

$$Q_i^G - Q_i^D = \sum_{j=1}^N V_i V_j [g_{ij}\sin(\theta_i - \theta_j) - b_{ij}\cos(\theta_i - \theta_j)], \forall i,$$

$$\underline{P}_i \leq P_i^G \leq \overline{P}_i, \forall i,$$

$$\underline{Q}_i \leq Q_i^G \leq \overline{Q}_i, \forall i,$$

$$\underline{V}_i \leq V_i + f_i^2 \leq \overline{V}_i, \forall i.$$

The OPF problem in the rectangular coordinates is reformulated as:

$$\min \sum_{i=1}^N f_i(P_i^G)$$

$$\text{s.t. } P_i^G - P_i^D = (e_i^2 + f_i^2)g_{ii} + \sum_{j \in \delta(i)} [e_i(g_{ij}e_j^i - b_{ij}f_j^i) + f_i(g_{ij}f_j^i - b_{ij}e_j^i)],$$

$$\forall i,$$

$$Q_i^G - Q_i^D = -(e_i^2 + f_i^2)b_{ii} + \sum_{j \in \delta(i)} [f_i(g_{ij}e_j^i - b_{ij}f_j^i) - e_i(g_{ij}f_j^i - b_{ij}e_j^i)], \forall i,$$

$$\underline{P}_i \leq P_i^G \leq \overline{P}_i, \forall i,$$

$$\underline{Q}_i \leq Q_i^G \leq \overline{Q}_i, \forall i,$$

$$\underline{V}_i^2 \leq e_i^2 + f_i^2 \leq \overline{V}_i^2, \forall i,$$

$$e_j^i = e_j, \forall i, \forall j \in \delta(i),$$

$$f_j^i = f_j, \forall i, \forall j \in \delta(i).$$

Variables can be arranged at each node i into two groups $x_i = (P_i^G, Q_i^G, e_i, f_i) \in R^4$ and $y_i = (e_j^i, f_j^i, \forall j \in \delta(i)) \in R^{2|\delta(i)|}$, and $\Omega_i$ defines the feasible region for $(x_i, y_i)$ of each node i in the network. Then, the problem is rewritten as:

$$\min \sum_{i=1}^N [f_i(x_i) + 1_{\Omega_i}(x_i, y_i)]$$

$$\text{s.t. } e_i^j = e_i, \forall i, \forall j \in \delta(i)$$

$$f_i^j = f_i, \forall i, \forall j \in \delta(i).$$

According to an exemplary embodiment of the present invention, an augmented Lagrangian function describing the dynamics of the network can be defined in terms of local variables (primal variables x and y and update dual variables $\lambda$ and $\mu$). Such that the augmented Lagrangian function can be written as:

$$L(x, y, \lambda, \mu) = \sum_{i=1}^N [f_i(x_i) + 1_{\Omega_i}(x_i, y_i)] +$$

$$\sum_{i=1}^N \sum_{j \in \delta(i)} [\lambda_i^j(e_i - e_i^j) + \mu_i^j(f_i - f_i^j)] + \frac{\rho}{2} \sum_{i=1}^N \sum_{j \in \delta(i)} [(e_i - e_i^j)^2 + (f_i - f_i^j)^2].$$

Using an ADMM (Alternating Direction Multiplier Method) algorithm to alternate between primal variables x and y and update dual variables $\lambda$ and $\mu$, the augmented Lagrangian can be completely decomposed to subproblems at each node, yielding a fully decentralized OPF algorithm.

The ADMM algorithm inherits the decomposability of dual ascent type algorithms and the convergence properties of the method of multipliers. It intends to solve the following problem $$\min_{x,y} f(x) + g(y)$$

$$\text{s.t. } Ax + By = c.$$

Introducing dual variable $\lambda$ and a positive penalty parameter $\rho$, the augmented Lagrangian is formed as:

$$L_\rho(x, y, \lambda) = f(x) + g(y) + \lambda^T(Ax + By - c) + \frac{\rho}{2}\|Ax + By - c\|_2^2.$$

ADMM includes the following iterations:

$$x^{k+1} := \arg\min_x L_\rho(x, y^k, \lambda^k),$$

$$y^{k+1} := \arg\min_y L_\rho(x^{k+1}, y, \lambda^k),$$

$$\lambda^{k+1} := \lambda^k + \rho(Ax^{k+1} + By^{k+1} - c),$$

where the first two steps minimize over primal variables x, y, and the third step updates the dual variable λ with step size ρ>0.

According to an exemplary embodiment of the present invention, a fully decentralized OPF at a k-th iteration is given as follows:

Fix $(e_i^j)^k, (f_i^j)^k$ for all i,j and the Lagrangian multipliers $(\lambda_i^j)^k, (\mu_i^j)^k$. Each node i solves the following problem:

$$\min_{P_i^G, Q_i^G, e_i, f_i} f_i(P_i^G) + \sum_{j \in \delta(i)} \left[ (\lambda_i^j)^k (e_i - (e_i^j)^k) + (\mu_i^j)^k (f_i - (f_i^j)^k) \right] +$$

$$\frac{\rho}{2} \left[ (e_i - (e_i^j)^k)^2 + (f_i - (f_i^j)^k)^2 \right]$$

s.t. $P_i^G - P_i^D = (e_i^2 + f_i^2) g_{ii} +$ $$\sum_{j \in \delta(i)} \left[ e_i (g_{ij}(e_j^i)^k - b_{ij}(f_j^i)^k) + f_i (g_{ij}(f_j^i)^k + b_{ij}(e_j^i)^k) \right]$$

$Q_i^G - Q_i^D = -(e_i^2 + f_i^2) b_{ii} +$ $$\sum_{j \in \delta(i)} \left[ f_i (g_{ij}(e_j^i)^k - b_{ij}(f_j^i)^k) - e_i (g_{ij}(f_j^i)^k + b_{ij}(e_j^i)^k) \right]$$

$\underline{P}_i \le P_i^G \le \overline{P}_i, \underline{Q}_i \le Q_i^G \le \overline{Q}_i, \underline{V}_i^2 \le e_i^2 + f_i^2 \le \overline{V}_i^2.$ The information that each node i needs includes its own estimation of the adjacent nodes voltages $((e_j^i)^k, (f_j^i)^k)$, its adjacent nodes estimation of i's voltages $((e_i^j)^k, (f_i^j)^k)$, and Lagrangian multipliers $((\lambda_i^j)^k, (\mu_i^j)^k)$. The first set of voltage information is available at the node, while the second set of voltage information and the Lagrangian multipliers require a local message passing between node i and its neighbors. Here, note that each node solves the problem with decision variables $(P_i^G, Q_i^G, e_i, f_i)$, where $P_i^G$ and $Q_i^G$ are the node's own power output.

Fix $x^{k+1}$ and $(\lambda^k, \mu^k)$. Each node i solves the following problem:

$$\min_{e_j^i, f_j^i, \forall j \in \delta(i)} \sum_{j \in \delta(i)} \left[ (\lambda_j^i)^k (\alpha_j - e_j^i) + (\mu_j^i)^k (\beta_j - f_j^i) \right] +$$

$$\sum_{j \in \delta(i)} \frac{\rho}{2} \left[ (\alpha_j - e_j^i)^2 + (\beta_j - f_j^i)^2 \right]$$

s.t. $(P_i^G)^{k+1} - P_i^D =$ $$(\alpha_i^2 + \beta_i^2) g_{ii} + \sum_{j \in \delta(i)} [\alpha_i (g_{ij} e_j^i - b_{ij} f_j^i) + \beta_i (g_{ij} f_j^i + b_{ij} e_j^i)],$$

$(Q_i^G)^{k+1} - Q_i^D = -(\alpha_i^2 + \beta_i^2) b_{ii} + \sum_{j \in \delta(i)} [\beta_i (g_{ij} e_j^i - b_{ij} f_j^i) - \alpha_i (g_{ij} f_j^i + b_{ij} e_j^i)],$ where $\alpha_i = (e_i)^{k+1}, \beta_i = (f_i)^{k+1}, \alpha_j = (e_j)^{k+1}, \beta_j = (f_j)^{k+1}$ for all $j \in \delta(i)$.

The information needed at each node i include adjacent nodes' voltages $((e_j)^{k+1}, (f_j)^{k+1})$ and Lagrangian multipliers $((\lambda_j^i)^k, (\mu_j^i)^k)$. The voltage information requires a local message passing between node i and its neighbors, while the multipliers information can be processed and stored at node i.

Update the Lagrangian multipliers $(\lambda_j^i, \mu_j^i)$ at each node i, $(\lambda_j^i)^{k+1} = (\lambda_j^i)^k + \rho((e_j)^{k+1} - (e_j^i)^{k+1}), \forall j \in \delta(i),$ $(\lambda_j^i)^{k+1} = (\lambda_j^i)^k + \rho((f_j)^{k+1} - (f_j^i)^{k+1}), \forall j \in \delta(i),$ According to an exemplary embodiment of the present invention, the message-passing algorithm is given as follows (see also method 400, FIG. 4).

Each node i receives voltage estimates $((e_i^j)^k, (f_i^j)^k)$ and Lagrangian multipliers $((\lambda_i^j)^k, (\mu_i^j)^k)$ from its neighbors $j \in \delta(i)$ (401). Each node i then computes $((P_i^G)^{k+1}, (Q_i^G)^{k+1}, (e_i)^{k+1}, (f_i)^{k+1})$ and passes this result to its neighbors (402).

Each node i uses its own information $((P_i^G)^{k+1}, (Q_i^G)^{k+1}, (e_i)^{k+1}, (f_i)^{k+1})$, multipliers $((\lambda_i^j)^k, (\mu_i^j)^k)$, and neighbors voltages $((e_i^j)^{k+1}, (f_i^j)^{k+1})$ to compute $((e_j^i)^{k+1}, (f_j^i)^{k+1})$ (403).

Each node i updates its multipliers using its neighbor's true voltages $((e_j)^{k+1}, (f_j)^{k+1})$ and its own estimate $((e_j^i)^{k+1}, (f_j^i)^{k+1})$ (404). A convergence is used as a stopping criteria controlling the number of iterations (405). For example, the decentralized methods are terminated if the objective value obtained has relative error less than $10^{-2}$ with respect to a global value (e.g., optimum), which is pre-computed by a global OPF solver. It should be understood that different stopping criteria can be used (e.g., infeasibility residual less than $10^{-3}$).

According to an exemplary embodiment of the present invention, the OPF problem in the rectangular coordinates is reformulated as:

$$\min_{V_i, P_i^G, Q_i^G, v_i, \theta_i} \sum_{i=1}^{N} f_i(P_i^G)$$

s.t. $P_i^G - P_i^D = \sum_{j=1}^{N} V_i V_j^i [g_{ij} \cos(\theta_i - \theta_j^i) + b_{ij} \sin(\theta_i - \theta_j^i)], \forall i,$ $Q_i^G - Q_i^D = \sum_{j \in \delta(i)} V_i V_j^i [g_{ij} \sin(\theta_i - \theta_j^i) - b_{ij} \cos(\theta_i - \theta_j^i)], \forall i,$ $\underline{P}_i \le P_i^G \le \overline{P}_i, \underline{Q}_i \le Q_i^G \le \overline{Q}_i, \forall i,$ $\underline{V}_i \le V_i \le \overline{V}_i, \underline{\theta}_i \le \theta_i \le \overline{\theta}_i, \forall i,$ $V_i^j = V_i, \theta_i^j = \theta_i, \forall i, j \in \delta(i).$ Let $x_i = (P_i^G, Q_i^G, V_i, \theta_i)$ and $y_i = (V_j^i, \theta_j^i \forall j \in \delta(i))$ for all $i \in N$. The augmented Lagrangian is given as:

$$L(x, y, \lambda, \mu) = \sum_{i=1}^{N} [f_i(x_i) + 1_{\Omega_i}(x_i, y_i)] +$$

$$\sum_{i=1}^{N} \sum_{j \in \delta(i)} [\lambda_i^j (V_i - V_i^j) + \mu_i^j (\theta_i - \theta_i^j)] + \frac{\rho}{2} \sum_{i=1}^{N} \sum_{j \in \delta(i)} [(V_i - V_i^j)^2 + (\theta_i - \theta_i^j)^2].$$

When the polar formation is used, a fully decentralized OPF at a k-th iteration is given as follows.

Fix an estimation of the adjacent nodes voltages $((V_i^j)^k, (\theta_i^j)^k)$ and the multipliers $((\lambda_j^i)^k, (\mu_j^i)^k)$ for all i, j. Each node i solves the following problem:

$$\min_{P_i^G, Q_i^G, V_i, \theta_i} f_i(P_i^G) + \sum_{j \in \delta(i)} \left[ (\lambda_i^j)^k (V_i - (V_i^j)^k) + (\mu_i^j)^k (\theta_i - (\theta_i^j)^k) \right] +$$

$$\frac{\rho}{2} \left[ (V_i - (V_i^j)^k)^2 + (\theta_i - (\theta_i^j)^k)^2 \right]$$

s.t. $P_i^G - P_i^D = \sum_{j \in \delta(i)} V_i (V_j^i)^k [g_{ij} \cos(\theta_i - (\theta_j^i)^k) + b_{ij} \sin(\theta_i - (\theta_j^i)^k)],$ $Q_i^G - Q_i^D = \sum_{j \in \delta(i)} V_i (V_j^i)^k [g_{ij} \sin(\theta_i - (\theta_j^i)^k) - b_{ij} \cos(\theta_i - (\theta_j^i)^k)],$ -continued $$\underline{P}_i \leq P_i^G \leq \overline{P}_i, \underline{Q}_i \leq Q_i^G \leq \overline{Q}_i,$$

$$\underline{V}_i \leq V_i \leq \overline{V}_i, \underline{\theta}_i \leq \theta_i \leq \overline{\theta}_i.$$

Here, each node i uses information including its own estimation of the adjacent nodes voltages $((V_j^i)^k, (\theta_j^i)^k)$, its adjacent nodes estimation of i's voltages $((V_i^j)^k, (\theta_i^j)^k)$, and multipliers $((\lambda_i^j)^k, (\mu_i^j)^k)$. The first set of voltage information is available at the node, while the second set of voltage information and the Lagrangian multipliers require a local message passing between node i and its neighbors.

Fix $x^{k+1}$ and $(\lambda^k, \mu^k)$. Each node i solves the following problem:

$$\min \sum_{j \in \delta(i)} \left[ (\lambda_i^j)^k (\alpha - V_i^j) + (\mu_i^j)^k (\beta - \theta_i^j) \right] + \frac{\rho}{2} \left[ (\alpha - V_i^j)^2 + (\beta - \theta_i^j)^2 \right]$$

$$\text{s.t. } (P_i^G)^{k+1} - P_i^D = \sum_{j \in \delta(i)} \alpha V_j^i [g_{ij} \cos(\beta - \theta_j^i) + b_{ij} \sin(\beta - \theta_j^i)]$$

$$(Q_i^G)^{k+1} - Q_i^D = \sum_{j \in \delta(i)} \alpha V_j^i [g_{ij} \sin(\beta - \theta_j^i) - b_{ij} \cos(\beta - \theta_j^i)]$$

where $\alpha = (V_i)^{k+1}$, $\beta = (\theta_i)^{k+1}$. Each node i needs to know its neighbor nodes' voltages $((V_j)^{k+1}, (\theta_j)^{k+1})$ and Lagrangian multipliers $((\lambda_j^i)^k, (\mu_j^i)^k)$ for $j \in \delta(i)$. The voltage information requires a local message passing between node i and its neighbors, while the multipliers information can be processed and stored at node i.

Update multipliers $(\lambda_j^i, \mu_j^i)$ at each node i:

$$(\lambda_j^i)^{k+1} = (\lambda_j^i)^k + \rho((V_j)^{k+1} - (V_j^i)^{k+1}), \forall j \in \delta(i),$$

$$(\mu_j^i)^{k+1} = (\mu_j^i)^k + \rho((\theta_j)^{k+1} - (\theta_j^i)^{k+1}), \forall j \in \delta(i),$$

Within the electric power system, the OPF enables individual resource computation at the node level, wherein a node computes its own level of generation/consumption using an OPF module (see for example, processor 501, FIG. 5) that implements a nodal level computation. Individual resource communication with neighboring nodes enables the exchange of local information using a communication module (see for example, network I/F 505, FIG. 5) at each node. Collectively, the generation and consumption across multiple nodes minimizes the total cost of generation, and satisfies physical power flow constraints.

Figure 2:
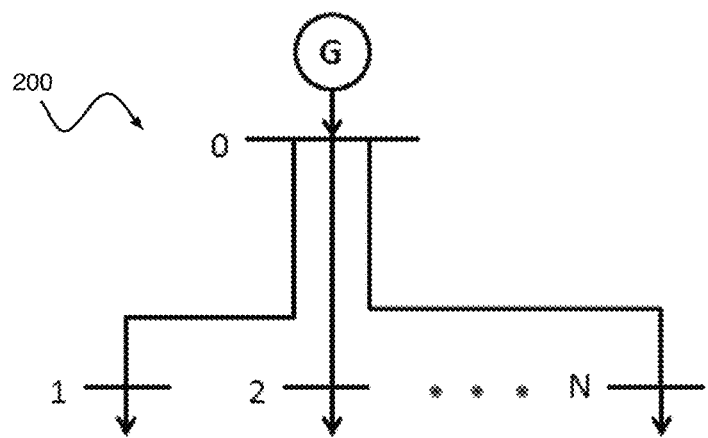
FIG. 2 is a radial network according to an exemplary embodiment of the present invention.

FIG. 2 shows a radial network 200 including a generator node 0 and load nodes 1, 2, . . . N. For network 200, computational results for a rectangular AC OPF and a polar AC OPF in Table 1.

TABLE 1

| | Rectangular AC OPF | | | Polar AC OPF | | |
|---|---|---|---|---|---|---|
| N | iter | $T_S$ (s) | $T_P$ (s) | iter | $T_S$ (s) | $T_P$ (s) |
| 5 | 33 | 7.66 | 1.28 | 54 | 13.45 | 2.24 |
| 10 | 44 | 15.26 | 1.39 | 95 | 42.09 | 3.83 |
| 20 | 63 | 37.71 | 1.80 | 157 | 125.91 | 6.00 |
| 30 | 85 | 76.89 | 2.48 | 225 | 252.50 | 8.15 |
| 40 | 102 | 121.87 | 2.97 | 290 | 443.95 | 10.82 |
| 50 | 128 | 198.40 | 3.89 | 367 | 807.34 | 15.83 |

For each method, an accumulated CPU time ($T_S$) of the serial implementation and the number of iterations (iter) are recorded. From this, a rough estimation of the CPU time is obtained in a parallel implementation ($T_p$), where $T_P \approx T_S/(N+1)$.

Figure 3:
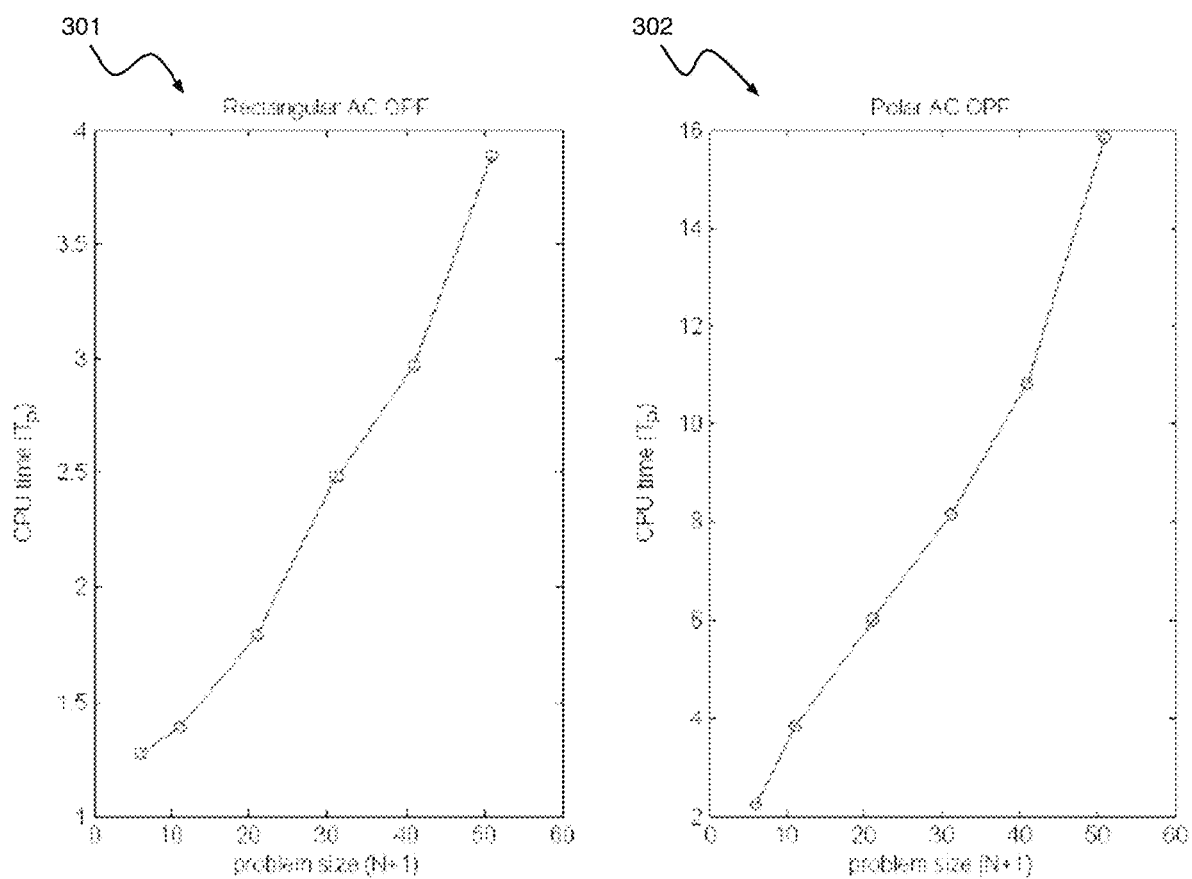
FIG. 3 shows plots of computation times versus problem size for different computations of an optimal power flow according to an exemplary embodiment of the present invention.

FIG. 3 shows plots of the computation times (Tp) for the rectangular AC OPF 301 and the polar AC OPF 302 versus problem size based on Table 1.

Figure 4:
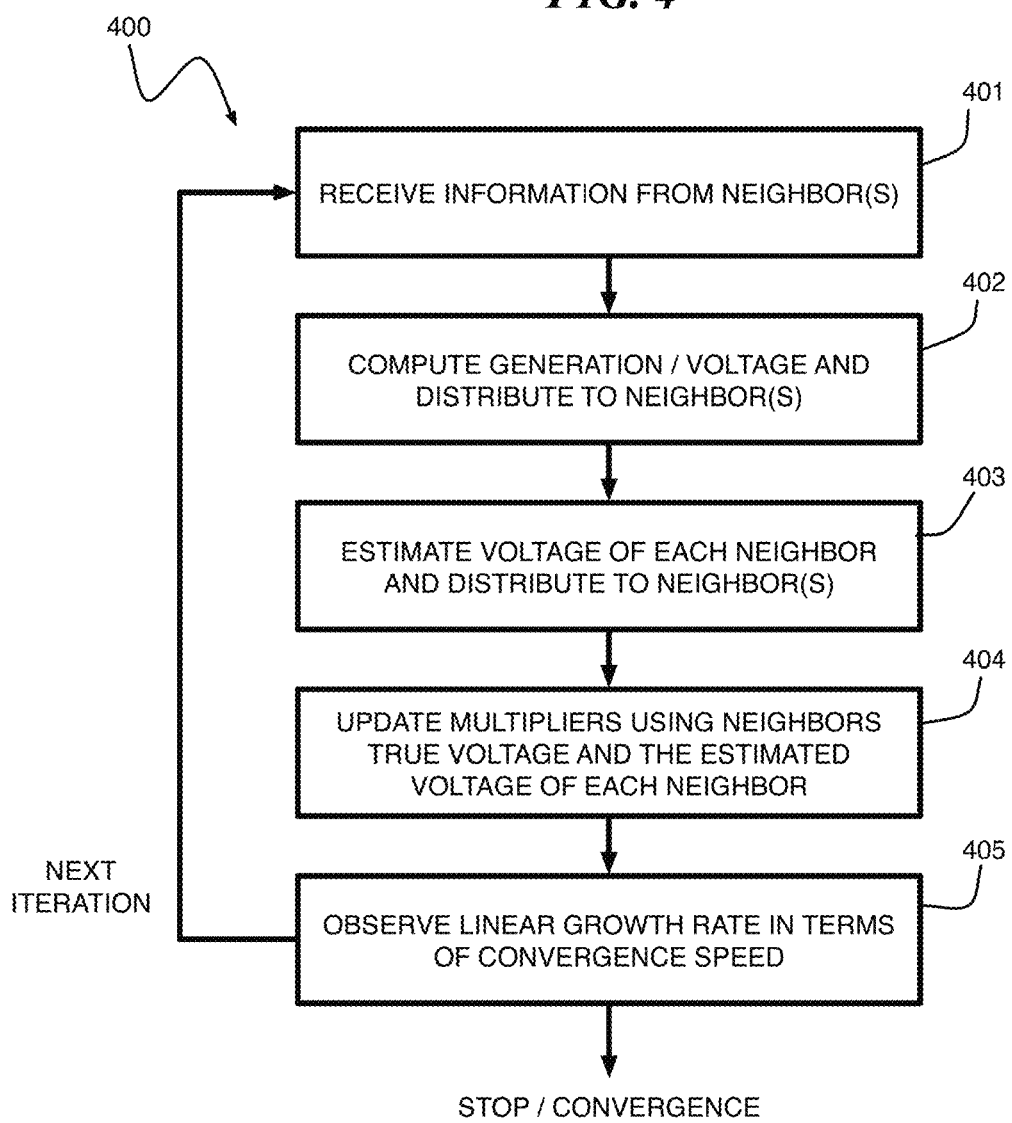
FIG. 4 is a flow diagram of a method for decomposing a power flow model into nodal level according to an exemplary embodiment of the present invention.

Referring to FIG. 4, a method 400 for decomposing a coupled and nonlinear power flow model into nodal level includes decomposing a global OPF problem by introducing local variables representing each node's view of its neighbors. Each node receives information (e.g., voltage information and multipliers) from its neighbors at 401. Each node determines its own generation and voltage and distributes this information to each neighbor at 402. Each node then estimates the voltage of each neighbor and distributes this information to any neighbor at 403. Each node updates its multipliers using the neighbors' true voltages received from the neighbors and the estimated voltage determined at the node. A linear growth rate is observed in terms of convergence speed at 405 in order to determine a completion of the OPF determination at the node. Here the convergence speed is a stopping criteria.

According to an exemplary embodiment of the present invention, the OPF preserves privacy within the network, wherein information sharing between nodes or users is limited (e.g., to the immediate neighbors). The OPF is scalable, wherein computation/communication complexity exhibits linear growth.

It should be understood that the methodologies of embodiments of the invention may be particularly well-suited for determining power output levels of generators in an electric power system.

By way of recapitulation, according to an exemplary embodiment of the present invention, a method for determining power output levels of generators in an electric power system includes receiving, at a node, information (e.g., voltage information) from the node's neighbors. Each node determines its own generation and voltage information and distributes this information to each neighbor. Each node estimates the voltage of each neighbor and distributes this information to each neighbor. Each node updates its multipliers using the neighbors' true voltages received from the neighbors and the estimated voltage determined at the node. A linear growth rate is observed in terms of convergence speed at in order to determine a completion of the OPF determination at the node.

The methodologies of embodiments of the disclosure may be particularly well-suited for use in an electronic device or alternative system. Accordingly, embodiments of the present invention may take the form of an entirely hardware embodiment or an embodiment combining software and hardware aspects that may all generally be referred to herein as a "processor," "circuit," "module" or "system."

Furthermore, it should be noted that any of the methods described herein can include an additional step of providing a system (e.g., node 101, FIG. 1) for determining a power output level of a generator in an electric power system (e.g., network 100, FIG. 1). According to an embodiment of the present invention, the system is a node receiving information (e.g., voltage information and multipliers) from its neighbors. Each node determines its own generation and voltage information and distributes this information to each of its neighbor. Each node estimates the voltage of each neighbor and distributes this information to each neighbor. Each node updates its multipliers using the neighbors' true voltages received from the neighbors and the estimated voltage determined at the node. A linear growth rate is observed in terms of convergence speed at in order to determine a completion of the OPF determination at the node. Further, a computer program product can include a tangible computer-readable recordable storage medium with code adapted to be executed to carry out one or more method steps described herein, including the provision of the system with the distinct software modules.

Figure 5:
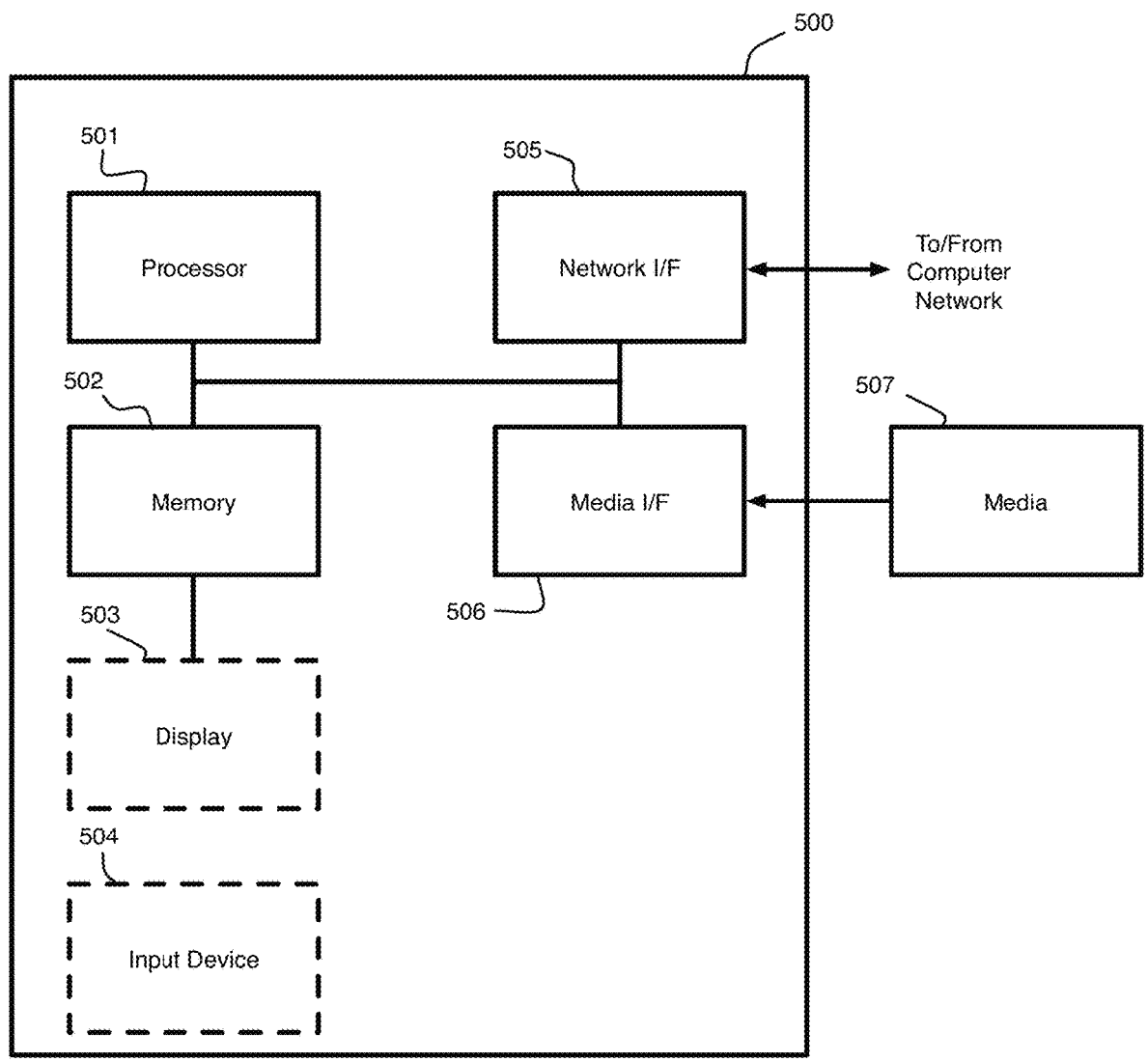
FIG. 5 is a diagram of a computer system configured for indexing video for determining power output levels of generators in an electric power system according to an exemplary embodiment of the present invention.

Referring to FIG. 5; FIG. 5 is a block diagram depicting an exemplary computer system for determining a power output level of a generator in an electric power system according to an embodiment of the present invention. The computer system shown in FIG. 5 includes a processor 501, memory 502, display 503, input device 504 (e.g., keyboard), a network interface (I/F) 505, a media IF 506, and media 507, such as a signal source, e.g., camera, Hard Drive (HD), external memory device, etc.

In different applications, some of the components shown in FIG. 5 can be omitted. The whole system shown in FIG. 5 is controlled by computer readable instructions, which are generally stored in the media 507. The software can be downloaded from a network (not shown in the figures), stored in the media 507. Alternatively, software downloaded from a network can be loaded into the memory 502 and executed by the processor 501 so as to complete the function determined by the software.

The processor 501 may be configured to perform one or more methodologies described in the present disclosure, illustrative embodiments of which are shown in the above figures and described herein. Embodiments of the present invention can be implemented as a routine that is stored in memory 502 and executed by the processor 501 to process the signal from the media 507. As such, the computer system is a general-purpose computer system that becomes a specific purpose computer system when executing routines of the present disclosure.

Although the computer system described in FIG. 5 can support methods according to the present disclosure, this system is only one example of a computer system. Those skilled of the art should understand that other computer system designs can be used to implement embodiments of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method of controlling a first power generating node of a plurality of power generating nodes in an electric power system comprising:
   receiving, at the first power generating node of the plurality of power generating nodes, voltage information and Lagrangian multipliers of all neighboring power generating nodes of the first power generating node within the electric power system;
   controlling the first power generating node to output an actual local power and an actual local voltage determined using the voltage information and the Lagrangian multipliers of the neighboring power generating nodes received by the first power generating node and distributing local voltage information about the actual local power and the actual local voltage output by the first power generating node to each of the neighboring power generating nodes;
   determining, by the first power generating node, an estimated voltage of each of the neighboring power generating nodes; and
   updating, by the first power generating node, a local Lagrangian multiplier using the voltage information received from the neighboring power generating nodes and the estimated voltage of each of the neighboring power generating nodes determined by the first power generating node and distributing the local Lagrangian multiplier to each of the neighboring power generating nodes,
   wherein each of the Lagrangian multipliers of the neighboring power generating nodes reflects voltage information received by a respective one of the neighboring power generating nodes from neighboring power generating nodes thereof and an estimated voltage of each of the neighboring power generating nodes of the respective node determined by the respective node.

2. The method of claim 1, performed by each node of the plurality of power generating nodes.

3. The method of claim 1, iteratively performed by the first power generating node, the method further comprising evaluating a stopping criteria after updating the local Lagrangian multiplier.

4. The method of claim 1, implemented as a fully distributed system wherein each of the plurality of power generating nodes communicates directly with all of its neighboring power generating nodes to distribute respective local voltage information and a respective local Lagrangian multiplier.

5. The method of claim 1, further comprising:
   distributing, by the first power generating node, the estimated voltage of each of the neighboring power generating nodes determined by the first power generating node to each of the neighboring power generating nodes.

6. A computer program product for controlling a first power generating node in an electric power system, the computer program product comprising a non-transitory computer readable storage medium having program instructions embodied therewith, the program instructions executable by a processor to cause the processor to perform a method comprising:
   receiving, at the first power generating node of the plurality of power generating nodes, voltage information and Lagrangian multipliers of all neighboring power generating nodes of the first power generating node within the electric power system;
   controlling the first power generating node to output an actual local power and an actual local voltage determined using the voltage information and the Lagrangian multipliers of the neighboring power generating nodes received by the first power generating node and distributing local voltage information about the actual local power and the actual local voltage output by the first power generating node to each of the neighboring power generating nodes;
   determining, by the first power generating node, an estimated voltage of each of the neighboring power generating nodes; and
   updating, by the first power generating node, a local Lagrangian multiplier using the voltage information received from the neighboring power generating nodes and the estimated voltage of each of the neighboring power generating nodes determined by the first power generating node and distributing the local Lagrangian multiplier to each of the neighboring power generating nodes,
   wherein each of the Lagrangian multipliers of the neighboring power generating nodes reflects voltage information received by a respective one of the neighboring power generating nodes from neighboring power generating nodes thereof and an estimated voltage of each of the neighboring power generating nodes of the respective node determined by the respective node.

7. The computer program product of claim 6, performed by each node of the plurality of power generating nodes.

8. The computer program product of claim 6, iteratively performed by the first power generating node, the method further comprising evaluating a stopping criteria after updating the local Lagrangian multiplier.

9. The computer program product of claim 6, implemented as a fully distributed system wherein each of the plurality of power generating nodes communicates directly with all of its neighboring power generating nodes to distribute respective local voltage information and a respective local Lagrangian multiplier.

10. The computer program product of claim 6, further comprising:
distributing, by the first power generating node, the estimated voltage of each of the neighboring power generating nodes determined by the first power generating node to each of the neighboring power generating nodes.

11. A generator in an electric power system configured to control a power output level comprising:
a computer program product comprising a computer readable storage medium having program instructions embodied therewith, the program instructions executable by a processor to cause the generator to:
receive, from at least one neighboring generator within the electric power system, voltage information and Lagrangian multipliers;
outputting a local power and a local voltage determined using the voltage information and the Lagrangian multipliers of the at least one neighboring generator received from the at least one neighboring generator and distributing local voltage information about the local power generation and the local voltage to the at least one neighboring generator;
determine an estimated voltage of the at least one neighboring generator and distributing the estimated voltage to the at least one neighboring generator; and
update a local Lagrangian multiplier using the voltage information received from the at least one neighboring generator and the estimated voltage of the at least one neighboring generator determined by the generator and distributing the local Lagrangian multiplier to the at least one neighboring generator,
wherein each of the Lagrangian multipliers of the at least one neighboring generator reflects voltage information received by a respective one of the at least one neighboring generator from neighboring generators thereof and an estimated voltage of each of the neighboring generators of the respective neighboring generator determined by the respective neighboring generator.

12. The generator of claim 11, iteratively executing the program of instructions and further comprising evaluating a stopping criteria after updating the local Lagrangian multiplier.

13. The generator of claim 12, further comprising a communication module configured for two-way communication with the at least one neighboring generator.

14. The generator of claim 11, further comprising a communication module distributing the estimated voltage and the local Lagrangian multiplier to the at least one neighboring generator.

* * * * *